(12) United States Patent
Yakobson et al.

(10) Patent No.: US 12,270,121 B2
(45) Date of Patent: Apr. 8, 2025

(54) COMPOSITION AND METHOD FOR FABRICATION OF NICKEL INTERCONNECTS

(71) Applicant: MacDermid Enthone Inc., Waterbury, CT (US)

(72) Inventors: Eric Yakobson, East Haven, CT (US); Shaopeng Sun, Orange, CT (US); Elie Najjar, Norwood, MA (US); Thomas Richardson, Killingworth, CT (US); Vincent Paneccasio, Jr., Madison, CT (US); Wenbo Shao, Stamford, CT (US); Kyle Whitten, Cheshire, CT (US)

(73) Assignee: MacDermid Enthone Inc., Waterbury, CT (US)

( * ) Notice: Subject to any disclaimer, the term of this patent is extended or adjusted under 35 U.S.C. 154(b) by 70 days.

(21) Appl. No.: 17/416,703

(22) PCT Filed: Jan. 31, 2020

(86) PCT No.: PCT/US2020/016020
§ 371 (c)(1),
(2) Date: Jun. 21, 2021

(87) PCT Pub. No.: WO2020/160352
PCT Pub. Date: Aug. 6, 2020

(65) Prior Publication Data
US 2022/0064811 A1      Mar. 3, 2022

Related U.S. Application Data

(60) Provisional application No. 62/799,461, filed on Jan. 31, 2019.

(51) Int. Cl.
*C25D 3/18*        (2006.01)
*C25D 5/02*        (2006.01)
(Continued)

(52) U.S. Cl.
CPC ............... *C25D 3/18* (2013.01); *C25D 5/02* (2013.01); *C25D 7/123* (2013.01); *C25D 21/10* (2013.01);
(Continued)

(58) Field of Classification Search
None
See application file for complete search history.

(56) References Cited

U.S. PATENT DOCUMENTS

| | | | |
|---|---|---|---|
| 5,164,069 A | * | 11/1992 | Cerwonka ............... C25D 3/16 106/1.19 |
| 7,670,950 B2 | | 3/2010 | Richardson et al. |
| 9,777,386 B2 | | 10/2017 | Doubina et al. |
| 2009/0188805 A1 | | 7/2009 | Moffat et al. |

(Continued)

FOREIGN PATENT DOCUMENTS

| | | | | |
|---|---|---|---|---|
| EP | 1489201 A2 | * | 12/2004 | ........... C07C 309/10 |
| EP | 2937450 A1 | * | 10/2015 | ............... C25D 3/16 |

(Continued)

OTHER PUBLICATIONS

English translation WO 2018186217. (Year: 2018).*

(Continued)

*Primary Examiner* — Stefanie S Wittenberg
(74) *Attorney, Agent, or Firm* — Carmody Torrance Sandak & Hennessey LLP (57) ABSTRACT

A nickel electrodeposition composition for via fill or barrier nickel interconnect fabrication comprising: (a) a source of nickel ions; (b) one or more polarizing additives; and (c) one or more depolarizing additives. The nickel electrodeposition composition may include various additives, including suitable acids, surfactants, buffers, and/or stress modifiers to produce bottom-up filling of vias and trenches.

19 Claims, 1 Drawing Sheet

EXAMPLES 1 - 4

(51) Int. Cl.
*C25D 7/12* (2006.01)
*C25D 21/10* (2006.01)
*H01L 21/288* (2006.01)
*H01L 21/768* (2006.01)

(52) U.S. Cl.
CPC .... *H01L 21/2885* (2013.01); *H01L 21/76877* (2013.01)

(56) References Cited

U.S. PATENT DOCUMENTS

| | | | | |
|---|---|---|---|---|
| 2010/0116675 | A1* | 5/2010 | Sklar | C25D 5/18 205/102 |
| 2015/0345039 | A1* | 12/2015 | Josell | C25D 5/04 205/295 |
| 2016/0104638 | A1 | 4/2016 | Preusse et al. | |
| 2016/0273117 | A1* | 9/2016 | Doubina | C25D 3/18 |
| 2018/0327922 | A1* | 11/2018 | Ibata | C25D 3/12 |

FOREIGN PATENT DOCUMENTS

| | | |
|---|---|---|
| JP | 2018/178178 A | 11/2018 |
| KR | 2015/0111426 A | 10/2015 |
| TW | 2013/47086 A | 11/2013 |
| WO | 2018/186217 A1 | 3/2018 |

OTHER PUBLICATIONS

English translation TW 201347086 (Year: 2013).*
Electrodeposition of Ni in Submicrometer Trenches, Kim, S-K et al., Journal of the Electrochemical Society, vol. 154, No. 9, pp. D443-D451, Jul. 2, 2007.
Nakamaru, Y. et al., "Fabrication of three-dimensional microstructure by nickel plating and photolithography," Transactions of the Institute of Metal Finishing, Sep. 1, 2009, vol. 87, No. 5, pp. 259-263.

* cited by examiner

COMPOSITION AND METHOD FOR FABRICATION OF NICKEL INTERCONNECTS

FIELD OF THE INVENTION

The present invention relates generally to a composition and process for metal electrodeposition, especially nickel and nickel alloy electrodeposition. The composition and process are useful for the metallization of vias and trenches in microelectronic devices, as well as for multiple nickel interconnect applications such as nickel pillars, nickel bumping, UBM barrier and RDL metallization applications.

BACKGROUND OF THE INVENTION

Integrated circuits are manufactured from semiconductor substrates with numerous devices, including, for example, transistors, capacitors, and resistors, that are interconnected into circuits. Interconnects typically include metal traces that connect these devices on the substrate. Similarly, multi-layered printed circuit boards are fabricated from layers of conductor metal sandwiched between layers of dielectrics and semiconductors that are required to be interconnected through vias or through-holes.

Metal-filled vias allow for three-dimensional (3D) stacking, thereby connecting various layers of conductor metal. Stacking provides for shorter signal path and faster, more efficient interconnects.

With a 3D or vertical integration, chips are stacked and connected together by vertical interconnects. The stack obtained comprises several layers or strata of active components or chips; it forms a three-dimensional integrated circuit (3D IC).

Some advantages of 3D integration include:
(1) improved performance, including reduction in propagation time and in dissipated power, increased operating speed of the system associated with faster communication between the functional blocks, increased bandwidth of each functional block, and greater immunity to noise;
(2) reduced cost resulting from increased integration density, better fabrication yield (due in part to the use of the generation of electronic chip most appropriate to each functional block), and improved reliability; and
(3) producing highly integrated systems by the stacking of heterogeneous technologies (also called co-integration), i.e. involving various materials and/or various functional components.

After the chips have been stacked, for example by bonding, they can be individually connected to the pins of the package using connecting wires. However, high-density interconnection of the chips can be obtained only by employing through-vias.

In some formation processes of 3D ICs, two wafers, each including an integrated circuit, are formed. The wafers are then bonded with the devices aligned. Deep vias are then formed to interconnect devices on the first and second wafers.

Through-silicon-vias (TSVs), also referred to as through-substrate-vias or through-wafer vias, are increasingly used as a way of implementing 3D ICs. Often, a bottom wafer is bonded to a top wafer. TSVs are often used in 3D ICs and stacked dies to provide electrical connections and/or to assist in heat dissipation. Through silicon vias are critical components of three-dimensional integrated circuits, and they can be found in RF devices, MEMs, CMOS image sensors, Flash, DRAM, SRAM, 3D-NAND memories, analog devices, and logic devices.

The quality of the interconnection of these devices is critical to the performance and reliability of the fabricated integrated circuit. In addition, fabrication of interconnects for microelectronic devices relies on complete filling of vias and trenches with electrodeposited metal.

One of the most commonly used metals for interconnects is electrodeposited copper. However, copper as the main interconnect conductor metal can present a number of challenges. One of the most significant challenges is interconnect reliability. Although copper is an excellent conductor, it is readily oxidized in ambient air. To protect copper from oxidation and in order to preserve its solderability, it is commonly plated by a layer or a stack of metals, including, for example, nickel, cobalt, silver, tin, palladium and gold.

Thus, reliability of these interconnects can be significantly improved if instead of protecting the top surface of the copper, the whole interconnect is fabricated from a metal other than copper that is less susceptible to reliability failures.

Furthermore, in the course of stacking layers of said devices, these layers experience multiple high temperature thermal excursions during the bonding process. Coefficients of thermal expansion (CTEs) of silicon and copper are very different. Silicon barely expands on exposure to high temperature used for bonding whereas copper expands significantly with each thermal cycle. Each subsequent Moore's law node brings about a combination of shrinking copper thickness and increasing number of stacking layers which results in ever increasing number of thermal exposures. Copper being a malleable and flexible metal with high CTE can experience cracking when exposed to multiple cycles of thermal excursions. Cracking of copper lines is a high reliability failure risk. Thus, there is a need to replace copper with a more rigid metal with higher tensile and yield strength that doesn't experience so much movement in relation to silicon during the layer bonding thermal cycles due to its higher thermal stability and higher rigidity and therefore is less vulnerable to cracking.

Copper also has a tendency to form intermetallic compounds with tin at a fairly high rate. Tin is the main component of solder that is typically used for attachment of various electronic components. Copper tin intermetallic compounds may further compromise the interconnect reliability.

Copper via fill electrodeposition technology is widely used for a variety of applications such as damascene processes, RDL, TSV and in high density interconnect (HDI) and sequential microvia buildup (SBU) printed circuit board manufacturing processes. Similar fill processes are used for pattern-plated through photoresist copper pillar process for wafer level packaging.

Copper via fill electrodeposition is described, U.S. Pat. No. 7,670,950 to Richardson et al., the subject matter of which is herein incorporated by reference in its entirety.

Cobalt has also been used for electroplating into recessed features, for example in U.S. Pat. No. 9,777,386 to Doubina et al., the subject matter of which is herein incorporated by reference in its entirety.

An alternative to copper may be nickel; however, boric acid has historically been an essential component of nickel electrodeposition chemistries. The function of boric acid is to buffer the cathode diffusion layer. During the nickel electrodeposition process a secondary reaction of hydrogen evolution occurs on the cathode due to reduction of a proton.

Hydrogen gas is being generated and released on the cathode while the diffusion layer gets depleted of protons thereby increasing the pH of the diffusion layer. Boric acid serves as a buffer that maintains relatively stable pH.

However, according to the European Commission, boric acid in high doses shows significant developmental toxicity and teratogenicity in rabbit, rat, and mouse fetuses as well as cardiovascular defects, skeletal variations, and mild kidney lesions. The European Commission has amended its classification of boric acid as reprotoxic category 2, R60 (may impair fertility) and R61 (may cause harm to the unborn child). Accordingly, alternatives to nickel electrodeposition chemistries that utilize boric acid are desired.

Additionally, since the quality of the interconnects is critical to the performance and reliability of fabricated integrated circuits, there is a need to modify internal stress in applied coatings or deposited vias that may cause fractures in the applied coating. Internal stress in applied coatings may cause blistering, peeling, and reduction of fatigue strength. The internal stress can be tensile in nature, causing the applied coating to contract, or compressive in nature, causing the applied coating to expand. Micro-cracking and macro-cracking within the applied deposit exposes integrated circuits to corrosion and ultimately reduced performance and reliability of the integrated circuits. Accordingly, there is a need for methods and additives to modify internal stress in applied coatings. Sometimes one metal layer has internal stress value which can be compensated for by applying another metal layer on top of it with the opposite stress value thereby allowing to keep the stress of the whole stack neutral.

Accordingly, there is a need to provide a solution to the above described problems.

SUMMARY OF THE INVENTION

It is an object of the present invention to provide electrodeposition compositions and processes for via fill metallization and interconnect fabrication that include a metal other than copper. In some embodiments, the metal in the electrodeposition composition may be nickel. Electrodeposition compositions may also advantageously include one or more polarizer/suppressors and one or more accelerator/depolarizers.

It is another object of the present invention to provide electrodeposition compositions and processes for via fill metallization that do not include boric acid.

It is another object of the present invention to provide internal stress modifiers in electrodeposition compositions and processes for via fill metallization.

Other objects and features will be in part apparent and in part pointed out hereinafter.

DETAILED DESCRIPTION OF THE PREFERRED EMBODIMENTS

The present invention relates generally to a nickel electrodeposition composition and a process for via fill metallization in microelectronic devices. As set forth herein, in one embodiment, the present invention is directed to a process for filling vias and trenches in microelectronic devices with a metal other than copper to improve reliability.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

As used herein, the term "acid" refers to any suitable acid, typically a Bronsted-Lowry acid, including but not limited to inorganic acids, carboxylic acids, alcohols, thiols, water, etc.

"Alkyl" as used herein, alone or as part of another group, refers to a straight, branched chain, or cyclic, saturated or unsaturated, hydrocarbon containing from 1 or 2 to 10 or 20 carbon atoms, or more. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, n-decyl, and the like. The term "alkyl" is intended to include both substituted and unsubstituted alkyl unless otherwise indicated and these groups may be substituted with groups selected from halo (e.g., haloalkyl), alkyl, haloalkyl, alkenyl, alkynyl, cycloalkyl, cycloalkylalkyl, aryl, arylalkyl, heterocyclo, heterocycloalkyl, hydroxyl, alkoxy (thereby creating a polyalkoxy such as polyethylene glycol), alkenyloxy, alkynyloxy, haloalkoxy, cycloalkoxy, cycloalkylalkyloxy, aryloxy, arylalkyloxy, heterocyclooxy, eterocyclolalkyloxy, mercapto, alkyl-S(O)$_m$, haloalkyl-S(O)$_m$, alkenyl-S(O)$_m$, alkynyl-S(O)$_m$, cycloalkyl-S(O)$_m$, cycloalkylalkyl-S(O)$_m$, aryl-S(O)$_m$, arylalkyl-S(O)$_m$, heterocyclo-S(O)$_m$, heterocycloalkyl-S(O)$_m$, amino, carboxy, alkylamino, alkenylamino, alkynylamino, haloalkylamino, cycloalkylamino, cycloalkylalkylamino, arylamino, arylalkylamino, heterocycloamino, heterocycloalkylamino, disubstitutedamino, acylamino, acyloxy, ester, amide, sulfonamide, urea, alkoxyacylamino, aminoacyloxy, nitro or cyano where m=0, 1, 2 or 3.

Alkyl may be saturated or unsaturated and hence the term "alkyl" as used herein is inclusive of alkenyl and alkynyl when the alkyl substituent contains one or more unsaturated bond (for example, one or two double or triple bonds). The alkyl group may optionally contain one or more heteroatoms (e.g., one, two, or three or more heteroatoms independently selected from O, S, and NR', where R' is any suitable substituent such as described immediately above for alkyl substituents), to form a linear heteroalkyl or heterocyclic group as specifically described below.

"Alkenyl" as used herein refers to an alkyl group as described above containing at least one double bond between two carbon atoms therein. Additionally, an alkenyl substituted with a hydroxy group or thiol group may be referred to as alkenol or alkenethiol, respectively. Exemplary substituents include vinyl, and allyl groups.

"Alkynyl" as used herein refers to an alkyl group as described above containing at least one triple bond between two carbon atoms therein. Additionally, an alkynyl substituted with a hydroxy group or thiol group may be referred to as alkynol or alkynethiol, respectively.

"Heterocyclic group" or "heterocyclo" as used herein alone or as part of another group, refers to an aliphatic (e.g., fully or partially saturated heterocyclo) or aromatic (e.g., heteroaryl) monocyclic- or a bicyclic-ring system. Monocyclic ring systems are exemplified by any 5 or 6 membered ring containing 1, 2, 3, or 4 heteroatoms independently selected from oxygen, nitrogen and sulfur. The 5 membered ring has from 0-2 double bonds and the 6 membered ring has from 0-3 double bonds. Representative examples of monocyclic ring systems include, but are not limited to, azetidine, azepine, aziridine, diazepine, 1,3-dioxolane, dioxane, dithiane, furan, imidazole, imidazoline, imidazolidine, isothiazole, isothiazoline, isothiazolidine, isoxazole, isoxazoline, isoxazolidine, morpholine, oxadiazole, oxadiazoline, oxadiazolidine, oxazole, oxazoline, oxazolidine, piperazine, piperidine, pyran, pyrazine, pyrazole, pyrazoline, pyrazolidine, pyridine, pyrimidine, pyridazine, pyrrole, pyrroline, pyrrolidine, tetrahydrofuran, tetrahydrothiophene, tetrazine, tetrazole, thiadiazole, thiadiazoline, thiadiazolidine, thiazole, thiazoline, thiazolidine, thiophene, thiomorpholine, thiomorpholine sulfone, thiopyran, triazine, triazole, trithiane, and the like. Bicyclic ring systems are exemplified by any of the above monocyclic ring systems fused to an aryl group as defined herein, a cycloalkyl group as defined herein, or another monocyclic ring system as defined herein. Representative examples of bicyclic ring systems include but are not limited to, for example, benzimidazole, benzothiazole, benzothiadiazole, benzothiophene, benzoxadiazole, benzoxazole, benzofuran, benzopyran, benzothiopyran, benzodioxine, 1,3-benzodioxole, cinnoline, indazole, indole, indoline, indolizine, naphthyridine, isobenzofuran, isobenzothiophene, isoindole, isoindoline, isoquinoline, phthalazine, purine, pyranopyridine, quinoline, quinolizine, quinoxaline, quinazoline, tetrahydroisoquinoline, tetrahydroquinoline, thiopyranopyridine, and the like. These rings include quaternized derivatives thereof and may be optionally substituted with groups selected from halo, alkyl, haloalkyl, alkenyl, alkynyl, cycloalkyl, cycloalkylalkyl, aryl, arylalkyl, heterocyclo, heterocycloalkyl, hydroxyl, alkoxy, alkenyloxy, alkynyloxy, haloalkoxy, cycloalkoxy, cycloalkylalkyloxy, aryloxy, arylalkyloxy, heterocyclooxy, heterocyclolalkyloxy, mercapto, alkyl-S(O)$_m$, haloalkyl-S(O)$_m$, alkenyl-S(O)$_m$, alkynyl-S(O)$_m$, cycloalkyl-S(O)$_m$, cycloalkylalkyl-S(O)$_m$, aryl-S(O)$_m$, arylalkyl-S(0)$_m$, heterocyclo-S(O)$_m$, heterocycloalkyl-S(O)$_m$, amino, alkylamino, alkenylamino, alkynylamino, haloalkylamino, cycloalkylamino, cycloalkylalkylamino, arylamino, arylalkylamino, heterocycloamino, heterocycloalkylamino, disubstitutedamino, acylamino, acyloxy, ester, amide, sulfonamide, urea, alkoxyacylamino, aminoacyloxy, nitro or cyano where m=0, 1, 2 or 3.

"Aryl" as used herein alone or as part of another group, refers to a monocyclic carbocyclic ring system or a bicyclic carbocyclic fused ring system having one or more aromatic rings. Representative examples of aryl include, azulenyl, indanyl, indenyl, naphthyl, phenyl, tetrahydronaphthyl, and the like. The term "aryl" is intended to include both substituted and unsubstituted aryl unless otherwise indicated and these groups may be substituted with the same groups as set forth in connection with alkyl above.

"Alkoxy" as used herein alone or as part of another group, refers to an alkyl group, as defined herein (and thus including substituted versions such as polyalkoxy), appended to the parent molecular moiety through an oxy group, —O—. Representative examples of alkoxy include, but are not limited to, methoxy, ethoxy, propoxy, 2-propoxy, butoxy, tert-butoxy, pentyloxy, hexyloxy and the like.

"Halo" as used herein refers to any suitable halogen, including —F, —Cl, —Br, and —I.

As used herein, the term "molecular weight" is the average mass of a molecule of a compound compared to a twelfth the mass of carbon 12 and calculated as the sum of the atomic weights of the constituent atoms.

As used herein, the term "zwitterion" is a molecule with two or more functional groups, of which at least one has a positive and one has a negative electrical charge and the net charge of the entire molecule is zero.

As used herein, the term "betaine" is a specific type of zwitterion, and is any neutral chemical compound with a positively charged cationic functional group that bears no hydrogen atom and with a negatively charged anionic functional group, wherein the anionic group is not immediately adjacent to the cationic group. Exemplary cationic groups include, but are not limited to, primary through quaternary ammonium, and phosphonium cations. Exemplary anionic groups include, but are not limited to, carboxylate, sulfonate, and sulfate groups.

In one aspect, the present invention relates to providing electrodeposition compositions and processes for via fill metallization that include a metal other than copper. In some embodiments, metals used for filling vias and trenches may be selected from the Group VIIIB of the Periodic Table of the Elements or more specifically from the Iron Group metals. Nickel and Cobalt are preferred metals, nickel being most preferred. Nickel-cobalt alloys can be used as well. Exemplary Nickel alloys include NiCo, NiW, NiFe, NiMo, CoRe, NiCoW, and NiCoFe. Exemplary cobalt alloys include CoW, CoFe, NiCoW, and NiCoFe. Thus, the electrodeposition composition may contain nickel and/or cobalt ions, alone or in combination with one or more alloying metals.

A preferred method for via fill metallization may be electrodeposition. In some embodiments, the metal in the electrodeposition composition may be nickel. Electrodeposition compositions may also advantageously include a polarizer (suppressor) and a depolarizer (accelerator).

In one embodiment, the present invention relates generally to a nickel electrodeposition composition and a method of using the nickel electrodeposition composition to metallize vias and trenches in the fabrication of microelectronics.

More particularly, in one embodiment, the present invention relates generally to a nickel electrodeposition composition comprising a source of nickel ions, and at least one of a polarizing and a depolarizing additive. As set forth above, the nickel electrodeposition composition may also contain one or more sources of alloying metal ions.

In some preferred embodiments, the electrodeposition composition comprises:
  a) a source of nickel ions;
  b) one or more polarizing additives
  c) one or more depolarizing additives;
  d) at least one acid; and
  e) at least one surfactant In some preferred embodiments, the electrodeposition composition comprises:
  a) a source of nickel ions;
  b) one or more polarizing additives
  c) one or more depolarizing additives;
  d) at least one acid;

e) at least one surfactant; and
f) at least one buffer

In some preferred embodiments, the electrodeposition composition comprises:
a) a source of nickel ions;
b) one or more polarizing additives
c) one or more depolarizing additives;
d) at least one acid;
e) at least one surfactant; and
f) at least one stress modifier In some preferred embodiments, the electrodeposition composition comprises:
a) a source of nickel ions;
b) one or more polarizing additives
c) one or more depolarizing additives;
d) at least one acid;
e) at least one surfactant;
f) at least one buffer; and
g) at least one stress modifier As described herein, the present invention relates generally to a nickel electrodeposition composition comprising a source of nickel ions with optionally alloying metal ions, additional surfactants, complexing agents, solvents and buffers. While specific labels may be provided to components, one of ordinary skill in the art would be able to understand and discern that certain components may serve simultaneous or alternative functions depending on the total bath compositions.

In some embodiments, exemplary sources of nickel ions include nickel acetates, nickel carboxylates, nickel chloride, nickel bromide, nickel sulfate, nickel sulfamate, nickel fluoroborate, and nickel pyrophosphate.

In some embodiments, as described herein, the nickel electrodeposition composition contains an acid or salt thereof. Exemplary acids include at least one of oxalic acid, citric acid, sulfamic acid, acetic acid, salicylic acid, sulfosalicylic acid, succinic acid, phthalic acid, boric acid, tartaric acid, and salts of any of the foregoing. In one embodiment, the composition is free of any boric acid and the acid is chosen to be an acid other than boric acid. Surprisingly, the inventors of the present invention have found that it is possible to produce a nickel electrodeposition composition that is capable of providing bottom up filling of vias and trenches without the use of boric acid.

In some embodiments, the electrolyte bath may include a surfactant. Exemplary surfactants may include anionic, cationic, and non-ionic surfactants. In some embodiments, the electrolyte bath may include an anionic surfactant such as Niaproof® 08 (aqueous solution of sodium 2-ethylhexyl sulfate) or Niaproof® 4 (aqueous solution of sodium tetradecyl sulfate), both available from Niacet Corporation. Other surfactants, including non-ionic surfactants such as polyethylene glycol ethers, alcohol ethoxylates, alkyl phenol ethoxylates, fatty acid ethoxylates, ethylene oxide-propylene oxide copolymers, and glycol esters, nonylphenols, ethoxylated nonylphenols, and nonoxynols would also be usable in the practice of the instant invention These surfactants decrease the surface tension of the electrolytic solution to allow for the release of the hydrogen byproduct. In plating applications, these surfactants eliminates pitting caused primarily by particulate matter or hydrogen bubbles while decreasing the surface tension of the bath.

The nickel via filling process may be controlled by the addition of a balanced combination of polarizing (suppressor) and depolarizing (accelerator) additives. Accordingly, in some embodiments the present invention involves the addition of one or more polarizers in combination with one or more depolarizers into the electrolyte used for electrodeposition.

Electrochemical techniques based on galvanostatic chronopotentiometry may be used to screen which of the additives can be used for nickel electrodeposition as polarizers or depolarizers. Without being beholden to a theory of operation, the proposed mechanism that drives metal via fill deposition is based on the difference of additive mass transport and adsorption rate between the field and the bottom of the vias. In this mechanism, high cathodic polarization due to higher rotation rate is indicative of the deposition rate on the field, while lower cathodic polarization at a lower agitation rate is indicative of the deposition rate at the bottom of the vias. A larger difference between the field deposition rate and the bottom of the via deposition rate results in a complete via fill.

Polarizers are defined herein as organic molecules that result in a negative shift of the metal deposition potential.

Examples of suitable polarizing additives (suppressors) include, for example, organic molecules selected from the group comprising heterocyclic betaines, alkynols, alkenols, and alkyl alcohols. Any of the foregoing may be substituted, multi-substituted, or unsubstituted.

In some embodiments, the suppressor may be at least one of pyridinium sulfate, pyridinium sulfonate, pyridinium sulfamate, pyridinium carbamate, pyridinium halide, and pyridinium acetate. Exemplary suppressors may include at least one of the following: pyridinium methyl sulfonate, pyridinium ethyl sulfonate, pyridinium propyl sulfonate, pyridinium butyl sulfonate.

In some embodiments, at least one suppressor may be phosphonium alkyl sulfate, phosphonium alkyl sulfonate, phosphonium alkyl sulfamate, phosphonium alkyl carbamate, phosphonium alkyl halide, phosphonium alkyl acetate, phosphonium methyl sulfonate, phosphonium ethyl sulfonate, phosphonium propyl sulfonate, phosphonium butyl sulfonate.

In some embodiments, at least one suppressor may be pyridinium methyl carboxylate, pyridinium ethyl carboxylate, pyridinium propyl carboxylate, pyridinium butyl carboxylate, ammonium methyl carboxylate, ammonium ethyl carboxylate, ammonium propyl carboxylate, ammonium butyl carboxylate, phosphonium methyl carboxylate, phosphonium ethyl carboxylate, phosphonium propyl carboxylate, phosphonium butyl carboxylate, pyridinium methyl sulfate, pyridinium ethyl sulfate, pyridinium propyl sulfate, pyridinium butyl sulfate, ammonium methyl sulfate, ammonium ethyl sulfate, ammonium propyl sulfate, ammonium butyl sulfate, phosphonium methyl sulfate, phosphonium ethyl sulfate, phosphonium propyl sulfate, phosphonium butyl sulfate, pyridinium methyl sulfamate, pyridinium ethyl sulfamate, pyridinium propyl sulfamate, pyridinium butyl sulfamate, ammonium methyl sulfamate, ammonium ethyl sulfamate, ammonium propyl sulfamate, ammonium butyl sulfamate, phosphonium methyl sulfamate, phosphonium ethyl sulfamate, phosphonium propyl sulfamate, phosphonium butyl sulfamate, pyridinium methyl acetate, pyridinium ethyl acetate, pyridinium propyl acetate, pyridinium butyl acetate, ammonium methyl acetate, ammonium ethyl acetate, ammonium propyl acetate, ammonium butyl acetate, phosphonium methyl acetate, phosphonium ethyl acetate, phosphonium propyl acetate, phosphonium butyl acetate.

In some embodiments, at least one suppressor may be alkoxylated alcohol, alkoxylated alkynol, alkoxylated alkenol, alkoxylated alkyl alcohol, C1-C20 alkoxylated alkynol. C1-C20 alkoxylated alkenol. C1-C20 alkoxylated alkyl alcohol, alkyl diol, methyl diol, ethyl diol, propyl diol, buytl diol, pentyl diol, ethenediol, propenediol, butendiol, pentenediol, methoxylated alkyl alcohol, ethoxylated alkyl alcohol, propoxylated alkyl alcohol, butoxylated alkyl alcohol, methoxylated alkenol, ethoxylated alkenol, propoxylated alkenol, butoxylated alkenol, methoxylated alkynol, ethoxylated alkynol, propoxylated alkynol, butoxylated alkynol, methoxylated ethynol, ethoxylated ethynol, propoxylated ethynol, butoxylated ethynol, methoxylated propynol, ethoxylated propynol, propoxylated propynol, butoxylated propynol, methoxylated propargyl alcohol, ethoxylated propargyl alcohol, propoxylated propargyl alcohol, butoxylated propargyl alcohol, methoxylated butynol, ethoxylated butynol, propoxylated butynol, butoxylated butynol, methoxylated pentynol, ethoxylated pentynol, propoxylated pentynol, butoxylated pentynol.

In some embodiments, at least one suppressor may be a zwitterion. In some embodiments at least one suppressor is a betaine. The betaines may be substituted or unsubstituted. Optional substitutions may be hydroxy, alkyl, alkynyl, alkenyl, and halide. In some embodiments, at least one suppressor may be alkyl betaine, cyclic betaine, aryl betaine, heterocyclic betaine, and hydroxylated betaine. In some embodiments, at least one suppressor may be vinyl betaine, propargyl betaine, and vinyl heterocyclic betaine.

Exemplary betaines may include (carboxymethyl)trimethylammonium hydrochloride, (formylmethyl)trimethylammonium chloride, 1,1'-[thiobis(mercaptophosphinothioylidene)]bispyridinium, bis(inner salt), P4S10-pyridine complex, N-(3-sulfopropyl)-N-methacroyloxyethyl-N,N-dimethylammonium betaine, (N,N-dimethylmyristylammonio)acetate, trigonelline hydrochloride, (lauryldimethylammonio)acetate, [2-(methacryloyloxy)ethyl]dimethyl-(3-sulfopropyl)ammonium hydroxide, N-methylnorpapaverine, 3-(1-pyridinio)-1-propanesulfonate, N-(trimethylamine-boranecarbonyl)proline methyl ester, hydroxysulfopropyl pyridinium betaine, sulfopropyl vinyl pyridinium betaine.

Depolarizers are defined herein as molecules that result in a shift in positive direction of the nickel deposition potential. Examples of suitable depolarizing additives (accelerators) include, for example organic sulfur compounds. More preferably, the depolarizing additives are selected from the group consisting of sulfimides, sulfonates, and sulfates. Specific examples of depolarizing additives include, but are not limited to sulfur-containing organic compounds, aromatic and aliphatic sulfonates, benzene, dibenzene, naphthalene, toluene sulfonamides, sulfonimides, such as benzene sulfonic acid, 1,3,6-naphthalene sulfonic acid sodium salt, p-toluene sulfonamide, o-benzoic sulfonimide, thiophen-2-sulfonic acid, benzene sulfinic acid and the like, which are usable alone or in combination.

The one or more polarizing additives and the one or more depolarizing additives are present in the composition at a ratio of between about 100:1 and about 1:100 more preferably between about 100:1 and about 1:1. For example, in some embodiments, the ratio of accelerator to suppressor may range from 100:1 to 1:1 by weight %. In some embodiments, the ratio of accelerator to suppressor may be selected from 90:1, 80:1, 70:1, 60:1, 50:1, 40:1, 30:1, 20:1, 15:1, 10:1, 5:1, 4:1, 3:1, 2:1, 1.5:1. In some embodiments, the ratio of suppressor to accelerator may be selected from 90:1, 80:1, 70:1, 60:1, 50:1, 40:1, 30:1, 20:1, 15:1, 10:1, 5:1, 4:1, 3:1, 2:1, 1.5:1. The ratio of the one or more polarizing additives to the one or more depolarizing additives may depend in part on the aspect ratio of the features being plated. For example, in one embodiment, features having an aspect ratio of between about 1:3 to about 3:1 may require a ratio of additives (polarizing additives to depolarizing additives) within the range of about 1:5 to about 10:1.

The one or more depolarizing additives are present in the electrolyte at a concentration of between about 100 mg/L and about 1000 mg/L, more preferably for some structure geometries between about 150 mg/L and about 500 mg/L, or about 300 mg/L. For other structure geometries more preferable between about 500 mg/L and about 1000 mg/L or about 750 mg/L.

The component that polarizes the metal deposition and renders a slower metal deposition rate near the opening of a via feature may be incorporated into the electroplating bath at concentrations between about 1 ppm and about 2000 ppm. In one embodiment, the component that suppresses the rate of nickel deposition near the opening of a via feature may be added to the electrolytic nickel deposition composition at concentrations between about 1 and about 1000 ppm or higher, preferably between about 100 ppm and about 500 ppm.

Bottom-up filling of the vias and trenches is thought to occur due to the additive transport and adsorption rate differences on the surfaces (commonly referred to as the "field") versus the bottom of the vias or trenches. The concentration of the one or more polarizers might be much greater on the field than on the bottom of the vias and trenches where the convection of the electrolyte is restricted by geometry due to its transport and adsorption rate. Conversely, concentration of the one or more depolarizers might be higher on the bottom of the vias and trenches than on the field because the depolarizer molecules must compete with the polarizer molecules for adsorption.

Nickel electrodeposition chemistries useful for via fill may be any of those known to those skilled in the art, including, for example, a Watts nickel bath (mixed sulfate/chloride), Barrett nickel bath (sulfamate), all sulfate, all chloride, organic acid sulfonate, phosphonate, fluoroborate, and mixtures thereof.

In addition, the nickel electrodeposition composition may contain an anti-pitting additive (wetting agent). Suitable anti-pitting additives include anionic surfactants such as sodium lauryl ethoxy sulfate, sodium lauryl ethoxy sulfonate, and other similar compounds. Anti-pitting additives are useful for avoiding pitting due to the clinging of air and hydrogen bubbles.

As described herein, the nickel electrodeposition composition may contain at least one buffer. Preferably, the at least one buffer is added to the nickel electrodeposition composition in addition to the at least one acid in the composition. Suitable buffers include, but are not limited to salts of weak organic or inorganic acids such as phthalates, citrates, acetates, succinates, oxalates, tartrates, phosphates, borates, and the like.

In some embodiments, the electrolyte may be heated at 20° to 70° C. More preferably from 40° to 60° C. In some embodiments, the electrolyte may be agitated by stirring, sonication or other methods.

In some embodiments, the pH of the electrodeposition composition is within the range of 2 to 5, preferably in the range of 3 to 4.5

In some embodiments, the current density may be from 0.5 ASD to 30 ASD. More preferably, the current density may be from 1-5 ASD for some applications. In some embodiments, the current density may be 5 ASD.

In some embodiments, the plating time may be from 1 minute to 60 minutes for some applications. More preferably, the plating time may be from 1 minutes to 45 minutes depending on the application requirements. One of skill in the art would recognize that the plating time and the current density may be tuned in order to achieve a target thickness.

Without being held to a theory of operation the filling of vias using nickel additives may occur based on convection-dependent adsorption CDA. For copper, which is expected to share similarities with Nickel, the filling mechanism is complicated because such deposition methods utilize three types of organic additives (accelerator, suppressor and leveler) for bottom-up filling of microvias. The filling performance of the copper plating solutions does not necessarily depend independently on the individual additive concentrations but may be influenced by the interaction between these additives. For example, some studies indicate that the intrinsic functions and interactions between additives are affected in the presence of chloride ions.

The adsorption of chloride ions on a cathode is potential-dependent because of their negative charges. Therefore, convection, and not diffusion and migration, may be mainly responsible for the transport of chloride ions to the cathode during plating. The specific functions of these organic additives depend on the surface coverage of chloride ions on the cathode. The suppressor and leveler might only work with a high surface coverage of chloride ions, but the accelerator works with a low surface coverage of chloride ions. Accordingly, strongly forced convection results in relatively slow metal deposition because inhibiting species dominate the cathodic reaction under conditions of high chloride ion coverage; weakly forced convection leads to relatively fast metal deposition because accelerating species dominate the cathodic reaction under conditions of low chloride ion coverage.

Likewise, for nickel plating solutions, the ratio of additives, may affect the performance of the electrodeposition composition. In some embodiments, the ratio between accelerators and suppressors may be tuned in order to achieve an optimal fill-in of various via sizes and aspect ratios.

In one aspect, the present invention relates to providing electrodeposition compositions and processes for fabrication of nickel interconnects that do not include boric acid. It is expressly contemplated for this concept and following embodiments to be used in combination with any of the preceding embodiments. Thus, while the electrodeposition composition may contain, and preferably does contain, an acid, the acid is selected from other acids that may suitably be used in the electrodeposition. Non-limiting examples include sodium or potassium tetraborate, sulfosalicylicate, acetate, succinate, tartrate, phthalate, citrate, sulfosalicylic acid, salicylic acid, acetic acid, succinic acid, and phthalic acid.

In one aspect, the present invention relates to providing internal stress modifiers/stress control agents in electrodeposition compositions and processes for via fill metallization. It is expressly contemplated for this concept and following embodiments to be used in combination with any of the preceding embodiments.

In some embodiments, the present invention relates generally to the addition of anion to the bath either by a separate additive or utilizing metal halide as the salt to modulate the internal stress based on what is desired. In some embodiments, the anion may be a halide ion. For example, chloride may be used to modify the internal stress from highly compressive to neutral to low tensile stress which might be desirable to compensate for another highly compressive metal layer in the metal stack. Examples of suitable stress modifiers include, but are not limited to chlorides, bromides, sulfonates, salicylates, sulfosalicylates, sulfonimides, and the like, such as potassium chloride. The stress modifier may be included in the electrodeposition composition at a concentration within the range of about 5 to about 100 g/L, more preferably within the range of about 50 to about 75 g/L.

In embodiments where the metal to be deposited is nickel, a halide ion may be used either as an additive to the nickel sulfate- or nickel sulfamate-based electrolyte or as a counter-ion for the nickel as part of the nickel salt for the electrolyte makeup.

The amount of internal stress may be measured by any technique known to one of skill in the art. For example, deposit test strips approved by ASTM Standard B975 are widely used to measure the internal stress of coatings and films deposited on a substrate.

In the following examples, exemplary electrodeposition compositions are studied for filling of vias by electrodeposition of nickel. The degree of filling by the exemplary embodiments were imaged by SEM cross-section of the vias.

Example 1: An exemplary nickel electrolyte composition was prepared comprising the following components:
  MacDermid Enthone Nickel Sulfamate LIQ 20 concentrate (150 g/L Ni)—485 mL/L
  Sulfamic Acid—1.7 g/L
  Boric acid—30 g/L
  Nickel Bromide Solution—55 mL/L
  Niaproof® 08—0.5 g/L
  MacDermid Enthone Brightener 63 (accelerator or depolarizer)—3 mL/L The pH of the electrolyte was adjusted to 4.0 using 50 g/L sulfamic acid solution and the electrolyte was heated to 55° C. A 2 cm×2 cm coupon with 23 micron diameter 30 micron deep vias with a copper seed layer and patterned photoresist was taped to a stainless steel coupon holder, immersed into the electrolyte and electroplated for 10 minutes at a current density of 5 ASD and with the electrode rotating at a 100 RPM rotation rate. The photoresist was stripped, and SEM cross-section demonstrated that the vias were filled to about 50%.

Example 2: The same electrolyte as in Example 1 was prepared with the addition of 2 mL/L Compound S2, a heterocyclic betaine (polarizer) having a molecular weight of less than 500. The photoresist was stripped, and SEM cross-section demonstrated that the vias were filled to about 60%.

Example 3: The same electrolyte as in Example 1 was prepared with the addition of 4 mL/L Compound S2. The photoresist was stripped, and SEM cross-section demonstrated that the vias were filled to about 100%.

Example 4: The same electrolyte as in Example 1 was prepared with the addition of 8 mL/L Compound S2. The photoresist was stripped, and SEM cross-section showed that 100% of the vias were filled with small overburden bumps on top of them.

Figure 1:
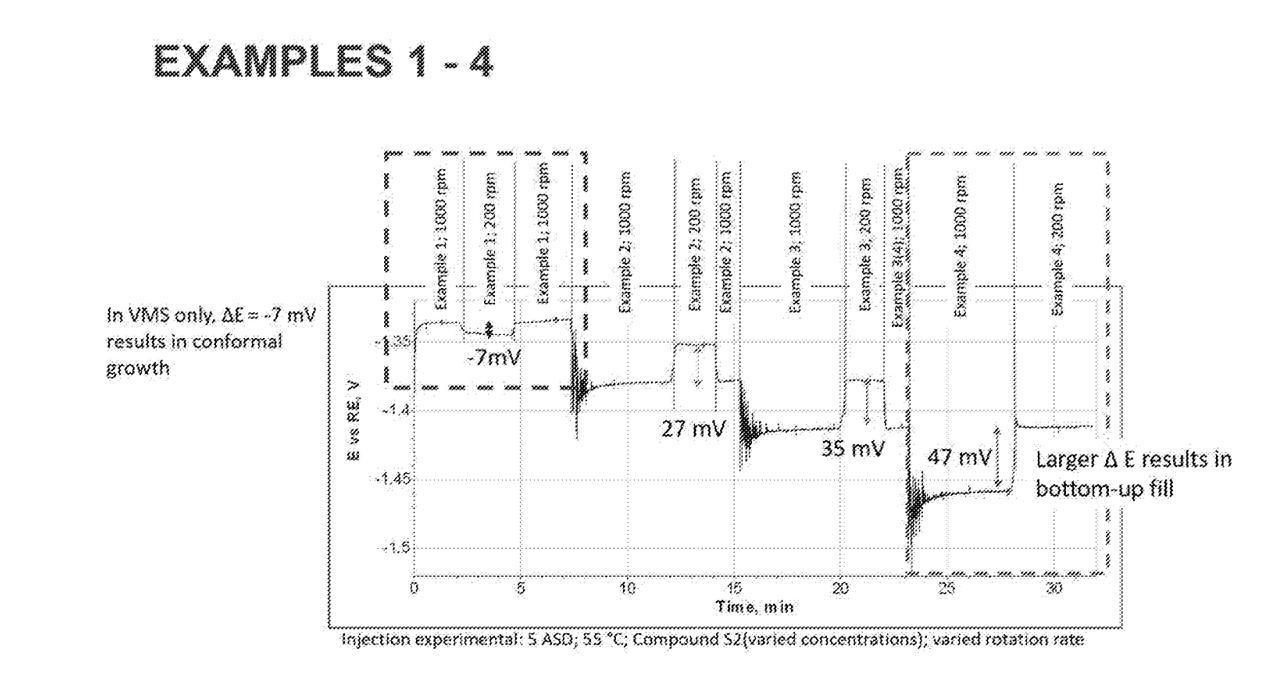
FIG. 1 is a galvanostatic chronopotentiometry graph according to examples 1 through 4.

FIG. 4 shows an is a galvanostatic chronopotentiometry graph according to Examples 1 through 4. The graph demonstrates a galvanostatic experiment of injections of Compound S2 at varied concentrations and with varied electrode rotation speeds. The experiment was conducted at 55° C. at 5 ASD. For each example, the electrode is rotated at 200 and 1000 rpm, and the difference in potential between fast and slow rotation is noted within the figure. In example 1, which contains an accelerator, but no S2, the difference in potential is −7 mV, which indicates depolarization and may be considered to likely indicate that this sample will result in conformal growth. Examples 2-4, which include increasing concentrations of S2 demonstrate the opposite effect, where the difference in potential is positive. A person of ordinary skill in the art would understand that this electrochemistry analysis is an indication for bottom up fill. Accordingly, without being held to a theory of operation, this result provides an indication that the addition of S2 exemplifies bottom-up filling.

Example 5: The same electrolyte as in Example 1 was prepared with the addition of 1 mL/L of Compound S3, an alkynol. The photoresist was stripped, and SEM cross-section showed that 25% of the vias were filled.

Example 6: The same electrolyte as in Example 1 was made up with 2 mL/L of Compound S4, an alkenol. The photoresist was stripped, and SEM cross-section showed that 45% of the vias were filled.

Example 7: The same electrolyte as in Example 1 was made up with 20 mL/L Compound S5, a hydroxylated heterocyclic betaine. The photoresist was stripped, and SEM cross-section showed that 100% of the vias were filled.

Example 8: The same electrolyte as in Example 1 was prepared with 20 mL/L Compound S6, a vinyl heterocyclic betaine. The photoresist was stripped, and SEM cross-section showed that 100% of the vias were filled.

Comparative Example 1: The same electrolyte as in Example 1 was prepared except that Compound S1/A1, an aryl sulfamide, was omitted from the electrolyte composition. The photoresist was stripped, and SEM cross-section showed that none of the vias were filled to any significant degree.

Comparative Example 2: The same electrolyte as in Example 1 was prepared with the exception that Compound S1/A1, an aryl sulfamide, was omitted from the electrolyte composition, and instead 4 mL/L of Compound S2, a heterocyclic betaine, was added to the composition. The photoresist was stripped, and SEM cross-section showed that none of the vias were filled to any significant degree.

Example 9: The same electrolyte as in Example 1 was prepared with the exception that 40 g/L potassium tetraborate was used in place of boric acid. The pH was adjusted to 4.0 with sulfamic acid and the solution was heated to 55° C. The internal stress was determined per ASTM Standard B975 and was found to be −99.6 MPa compressive.

Example 10: The same electrolyte as in Example 9 was prepared with the exception that 64 g/L potassium chloride was added. The pH was adjusted to 4.0 with sulfamic acid and the solution was heated to 55° C. The internal stress was determined per ASTM Standard B975 and was found to be 35.9 MPa tensile.

As Examples 9 and 10 illustrate, the addition of 64 g/L potassium chloride into the electrolyte reversed the polarity of the internal stress from compressive into tensile.

Example 11: The same electrolyte as in Example 1 was prepared except instead of 30 g/L boric acid, 45 g/L sulfosalicylic acid was added. 12 mL/L Compound S2 was added as well. A 1.3 cm×1.3 cm coupon with ~20 micron diameter ~8 micron deep vias with a copper seed layer and patterned photoresist was taped to a stainless steel coupon holder, immersed into the electrolyte and electroplated for 3 minutes at a current density of 5 ASD at 50 RPM rotation rate. The photoresist was stripped, and SEM cross-section demonstrated that the vias were filled to about 100%. The internal stress was determined per ASTM Standard B975 and was found to be −74.9 MPa compressive.

Example 12: The same electrolyte as in Example 1 was prepared. A 3.0 cm×3.0 cm coupon with ~20 micron diameter openings in the photoresist lined with a PVD copper seed layer was taped to a stainless steel coupon holder, immersed into the electrolyte and electroplated for 3 minutes at a current density of 5 ASD at 20 RPM rotation rate. The photoresist was stripped, and SEM cross-section demonstrated 3 micron thick nickel pillars suitable for UBM applications.

What is claimed is:

1. A method of filling vias in microelectronic devices by bottom up filling with nickel or an alloy of nickel, the method comprising the steps of:
   contacting a substrate with an electrodeposition composition, wherein the electrodeposition composition comprises:
   a. a source of nickel ions;
   b. one or more polarizing additives, wherein the one or more polarizing additives are selected from the group consisting of alkyl betaines, cyclic betaines, aryl betaines, heterocyclic betaines, hydroxylated betaines, alkoxylated alkenols, and combinations thereof;
   c. one or more depolarizing additives, wherein the one or more depolarizing additives comprise sulfimides, sulfonates, sulfates, or combinations thereof; and
   d. optionally, one or more alloying metals selected from the group consisting of iron, cobalt, molybdenum, rhenium, and combinations thereof,
      wherein the vias are contacted with the electrodeposition composition for a period of time sufficient to completely fill the vias by bottom up filling of the vias;
      wherein a difference of additive mass transport and adsorption rate between a field and a bottom of the vias results in bottom up fill of the vias, wherein a high cathodic polarization due to a higher electrode rotation rate is indicative of field deposition rate and a lower cathodic polarization at a lower electrode rotation rate is indicative of the deposition rate at the bottom of the vias and a larger difference between the field deposition rate and the deposition rate at the bottom of the vias results in complete bottom up fill of the vias.

2. The method of claim 1, wherein the electrodeposition composition further comprises an alloying metal selected from the group consisting of iron, cobalt, molybdenum, rhenium, and combinations of one or more of the foregoing.

3. The method of claim 1, wherein the electrodeposition composition further comprises a surfactant, wherein the surfactant is an anionic, cationic, or non-ionic surfactant.

4. The method of claim 1, wherein the electrodeposition composition further comprises a buffer, wherein the buffer comprises a salt of a weak organic or inorganic acid selected from the group consisting of phthalates, citrates, acetates, succinates, oxalates, tartrates, phosphates, borates, and combinations of one or more of the foregoing.

5. The method of claim 1, wherein the pH of the electrodeposition composition is within the range of 2 to 5.

6. The method according to claim 1, wherein the substrate is contacted with the electrodeposition composition for between 1 and 60 minutes.

7. The method according to claim 1, wherein the nickel electrodeposition composition is heated to a temperature of between 20° C. to 70° C.

8. The method according to claim 1, wherein the nickel electrodeposition composition is agitated.

9. The method according to claim 1, wherein the vias have an aspect ratio between 1:3 and 3:1 and the ratio of polarizing additives to depolarizing additives is in the range of 1:5 to 10:1.

10. The method according to claim 1, wherein the electrodeposition composition comprises an acid, wherein the acid is selected from the group consisting of oxalic acid, citric acid, sulfamic acid, salicylic acid, sulfosalicylic acid, succinic acid, phthalic acid, tartaric acid, and salts of any of the foregoing.

11. The method according to claim 10, wherein the acid comprises sulfamic acid.

12. The method according to claim 10, wherein the nickel electrodeposition composition is substantially free of boric acid and/or formaldehyde.

13. The method of claim 1, wherein the nickel electrodeposition composition comprises:
   a) at least one acid;
   b) 100 to 500 ppm of the one or more polarizing additives;
   c) 150 mg/L to 750 mg/L of the one or more depolarizing additives;
   d) at least one surfactant;
   e) at least one buffer; and
   f) a stress modifier, wherein the stress modifier is selected from the group consisting of bromides, sulfonate, salicylates, sulfosalicylates, and sulfonimides.

14. The method of claim 1, wherein the difference in the field deposition rate and the bottom of the via deposition rate is measured by conducting a galvanostatic experiment of injections of the electrodeposition composition at 55° C. and 5 ASD while rotating the electrode at 200 rpm and 1,000 rpm, wherein a difference in potential between fast and slow rotation is measured and a larger positive differential is indicative of complete bottom up fill.

15. The method of claim 14, wherein the difference in potential between fast and slow rotation is at least 27 mV.

16. The method of claim 15, wherein the difference in potential between fast and slow rotation is at least 35 mV.

17. The method of claim 16, wherein the difference in potential between fast and slow rotation is at least 47 mV.

18. A method of filling vias in microelectronic devices by bottom up filling, the method comprising the steps of:
   contacting a substrate with an electrodeposition composition, wherein the electrodeposition composition consists essentially of:
   a. a source of nickel ions;
   b. 100 to 500 ppm of one or more polarizing additives, wherein the one or more polarizing additives are selected from the group consisting of alkyl betaines, cyclic betaines, aryl betaines, heterocyclic betaines, hydroxylated betaines, alkoxylated alkenols, and combinations thereof;
   c. 150 mg/L to 750 mg/L of one or more depolarizing additives, wherein the one or more depolarizing additives comprise sulfimides, sulfonates, sulfates, or combinations thereof;
   d. at least one acid; and
   e. one or more of at least one surfactant, at least one buffer, and at least one stress modifier,
   wherein the vias are contacted with the electrodeposition composition for a period of time sufficient to completely fill the vias by bottom up filling of the vias;
   wherein a difference of additive mass transport and adsorption rate between a field and a bottom of the vias results in bottom up fill of the vias, wherein a high cathodic polarization due to a higher electrode rotation rate is indicative of field deposition rate and a lower cathodic polarization at a lower electrode rotation rate is indicative of the deposition rate at the bottom of the vias and a larger difference between the field deposition rate and the deposition rate at the bottom of the vias results in complete bottom up fill of the vias.

19. A method of filling vias in microelectronic devices by bottom up filling, the method comprising the steps of:
   contacting a substrate with an electrodeposition composition, wherein the electrodeposition composition comprises:
   a. a source of nickel ions;
   b. 100 to 500 ppm of one or more polarizing additives, wherein the one or more polarizing additives are selected from the group consisting of alkyl betaines, cyclic betaines, aryl betaines, heterocyclic betaines, hydroxylated betaines, alkoxylated alkenols, and combinations thereof;
   c. 150 mg/L to 750 mg/L of one or more depolarizing additives, wherein the one or more depolarizing additives comprise sulfimides, sulfonates, sulfates, or combinations thereof; and
   d. 50 to 100 g/L of a stress modifier, wherein the stress modifier is selected from the group consisting of bromides, sulfonate, salicylates, sulfosalicylates, and sulfonimides;
   wherein the vias are contacted with the electrodeposition composition for a period of time sufficient to completely fill the vias by bottom up filling of the vias;
   wherein a difference of additive mass transport and adsorption rate between a field and a bottom of the vias results in bottom up fill of the vias, wherein a high cathodic polarization due to a higher electrode rotation rate is indicative of field deposition rate and a lower cathodic polarization at a lower electrode rotation rate is indicative of the deposition rate at the bottom of the vias and a larger difference between the field deposition rate and the deposition rate at the bottom of the vias results in complete bottom up fill of the vias.

* * * * *